(12) United States Patent
Azzopardi et al.

(10) Patent No.: US 12,313,665 B2
(45) Date of Patent: May 27, 2025

(54) METHOD FOR MANUFACTURING A SHORT-CIRCUIT PROTECTION DEVICE, AND ASSOCIATED SHORT-CIRCUIT PROTECTION DEVICE AND POWER MODULE

(71) Applicant: SAFRAN, Paris (FR)

(72) Inventors: Stéphane Joseph Azzopardi, Moissy-Cramayel (FR); Toni Youssef, Moissy-Cramayel (FR); Rabih Khazaka, Moissy-Cramayel (FR); Donatien Henri Edouard Martineau, Moissy-Cramayel (FR); Thanh Long Le, Moissy-Cramayel (FR)

(73) Assignee: SAFRAN, Paris (FR)

( * ) Notice: Subject to any disclaimer, the term of this patent is extended or adjusted under 35 U.S.C. 154(b) by 439 days.

(21) Appl. No.: 17/607,558

(22) PCT Filed: Apr. 30, 2020

(86) PCT No.: PCT/EP2020/062155
§ 371 (c)(1),
(2) Date: Oct. 29, 2021

(87) PCT Pub. No.: WO2020/225133
PCT Pub. Date: Nov. 12, 2020

(65) Prior Publication Data
US 2022/0206043 A1 Jun. 30, 2022

(30) Foreign Application Priority Data
May 3, 2019 (FR) .................... 19 04683

(51) Int. Cl.
*G01R 3/00* (2006.01)
*G01R 15/18* (2006.01)

(52) U.S. Cl.
CPC ............. *G01R 3/00* (2013.01); *G01R 15/181* (2013.01)

(58) Field of Classification Search
CPC ................................... G01R 15/181
(Continued)

(56) References Cited

U.S. PATENT DOCUMENTS

| | | | | |
|---|---|---|---|---|
| 8,179,122 B2* | 5/2012 | Ibuki | ............... | G01R 15/181 324/117 R |
| 2005/0212642 A1* | 9/2005 | Pleskach | ........... | H01F 17/0033 336/200 |

(Continued)

FOREIGN PATENT DOCUMENTS

| | | |
|---|---|---|
| FR | 2 968 085 A1 | 6/2012 |
| JP | 2005-175156 A | 6/2005 |

(Continued)

OTHER PUBLICATIONS

International Search Report issued on Jun. 17, 2020 in PCT/EP2020/062155 filed Apr. 30, 2020, 3 pages.
(Continued)

*Primary Examiner* — Farhana A Hoque
(74) *Attorney, Agent, or Firm* — Oblon, McClelland, Maier & Neustadt, L.L.P.

(57) ABSTRACT

A method for manufacturing a short-circuit protection device, including producing, on a first face of a first substrate, a plurality of first electrically conductive segments; producing, on the first face, a plurality of electrically conductive pads each being in mechanical and electrical contact, through the base thereof, with a single corresponding first segment; producing, on a second face of a second substrate, a plurality of second electrically conductive segments; placing the first face and the second face opposite to each other, to bring a free end of each pad into mechanical and electrical
(Continued)

contact with a single corresponding second segment, such that the first segments, the second segments and the pads form a coil.

11 Claims, 1 Drawing Sheet

(58) Field of Classification Search
USPC .......................................................... 324/127
See application file for complete search history.

(56) References Cited

U.S. PATENT DOCUMENTS

| | | |
|---|---|---|
| 2008/0079418 A1 | 4/2008 | Rea et al. |
| 2012/0025087 A1* | 2/2012 | Daghighian ...... H01L 29/66462 |
| | | 257/E31.091 |
| 2012/0223697 A1 | 9/2012 | Lee et al. |
| 2014/0167733 A1 | 6/2014 | Buck et al. |
| 2015/0015244 A1 | 1/2015 | Ray et al. |
| 2015/0076951 A1* | 3/2015 | Lynch .................. H02K 15/024 |
| | | 310/195 |
| 2018/0113434 A1* | 4/2018 | Shapiro .............. B23K 37/0235 |
| 2018/0172738 A1* | 6/2018 | Kashiwaya .......... G01R 31/003 |
| 2019/0277893 A1 | 9/2019 | Kashiwaya |
| 2020/0386795 A1* | 12/2020 | Suzuki ............... G01R 19/0092 |

FOREIGN PATENT DOCUMENTS

| | | |
|---|---|---|
| WO | WO 2018/116679 A1 | 6/2018 |
| WO | WO 2018/189035 A1 | 10/2018 |
| WO | WO-2019102569 A1 * | 5/2019 ............. G01R 15/12 |

OTHER PUBLICATIONS

Preliminary French Search Report issued on Apr. 6, 2020 in French Patent Application No. 1904683 filed May 3, 2019, 2 pages (with Translation of Categories).

* cited by examiner

METHOD FOR MANUFACTURING A SHORT-CIRCUIT PROTECTION DEVICE, AND ASSOCIATED SHORT-CIRCUIT PROTECTION DEVICE AND POWER MODULE

TECHNICAL FIELD

The present invention relates to a method for manufacturing a short-circuit protection device. The invention also relates to a short-circuit protection device and power module comprising such a protection device.

The invention applies to the field of electronics, in particular to the field of power electronics.

STATE OF THE PRIOR ART

It is known to implement electrical energy conversion circuits between a first alternating current or direct current network to a second alternating current or direct current network. Such circuits are, for example, common in the field of aeronautics, where they are used to convert the electrical energy supplied by a main network (for example 115 V AC, 230 V AC, or else 540 V DC) under several forms, whether alternating current or direct current. Conventionally, such conversion circuits use switching elements such as transistors.

It is also known practice to monitor the occurrence of overcurrents affecting the switching elements of such conversion circuits, and this in order to prevent their premature aging, or even their destruction.

For example, in the case of conversion circuits including switching elements of the IGBT transistor type (standing for "Insulated Gate Bipolar Transistor"), it is known to implement a protection method called protection method "by desaturation measurement".

However, such a protection method is not suitable for conversion circuits incorporating large gap semiconductor switching elements, for example field effect transistors of the SiC MOSFET type (standing for "Silicon Carbide Metal Oxide Semiconductor Field Effect"). Indeed, the SiC MOSFET transistor operates in a linear region where the voltage at the terminals of said transistor (Vds) changes more slowly than the voltage at the terminals an IGBT transistor, even when the drain source current (Ids) increases. Thus, an overcurrent situation may be present for several switching cycles before a measurable variation in the voltage Vds occurs to allow a rapid detection, which may be sufficient to damage the component. Furthermore, the on-state resistance and hence the on-state voltage of a SiC MOSFET transistor being more temperature dependent than that of an IGBT transistor, it is generally difficult to determine a threshold voltage to be used for the implementation of the desaturation method.

In order to detect overcurrents affecting large gap semiconductor switching elements, it has been proposed to equip the conversion circuits incorporating the latter with current sensors, such as shunt resistors or Hall effect sensors.

Nevertheless, such current sensors are not satisfactory.

Indeed, such current sensors generally have an insufficient bandwidth, an excessive space requirement and a poor ability to withstand the high temperatures prevailing in the vicinity of the switching elements described above. In addition, using such current sensors amounts to adding parasitic elements likely to disturb the nominal operation of the switching elements.

An aim of the invention is therefore to propose a short-circuit protection device which has a higher bandwidth, a reduced space requirement, a better temperature resistance, and which is less disruptive to the nominal operation of the switching elements less than the protection devices of the state of the art.

DISCLOSURE OF THE INVENTION

To this end, the invention relates to a method of the aforementioned type, including:
  producing, on a first face of a first substrate, a plurality of first electrically conductive segments, each first segment being arranged on the periphery of a first connection surface of the first face, each first segment comprising a first end and an opposite second end, the first end being closer to the first connection surface than the second end, the first segments being electrically insulated from each other, each first segment being associated with a corresponding rank, the first segment associated with any given rank being arranged between the first segment of immediately lower rank and the first segment of immediately higher rank;
  producing, on the first face of a first substrate, a plurality of electrically conductive pads, which are distant from each other, each pad including a base and an opposite free end, each pad being in mechanical and electrical contact, through the base thereof, with a single corresponding first segment, the free end being at a distance from the first face;
  producing, on a second face of a second substrate, a plurality of second electrically conductive segments, which are electrically insulated from each other, each second segment being associated with first two segments of successive ranks;
  placing the first face of the first substrate and the second face of the second substrate opposite to each other, to bring the free end of each pad into mechanical and electrical contact with a single corresponding second segment, such that:
    each first segment is in mechanical and electrical contact with two pads of the plurality of pads;
    each second segment is in mechanical and electrical contact, on the one hand, with the pad which is in mechanical contact with the first segment of lower rank among the first two segments of successive ranks associated with the second segment, and which is closest to the first end of the first segment of lower rank, and on the other hand, with the pad which is in mechanical contact with the first segment of higher rank among the first two segments of successive ranks associated with said second segment, and which is closest to the second end of the first segment of higher rank;
  the first segments, the second segments and the pads thus forming a coil.

Indeed, such a method leads to the production of a coil forming a Rogowski sensor. Such a sensor has a satisfactory bandwidth.

Furthermore, such a Rogowski sensor does not include any electronic components likely to be damaged by an excessive temperature.

Moreover, the operation of such a Rogowski sensor is based on the induction phenomena, such that it is not in electrical contact with the switching elements and is therefore less likely to disrupt their operation than the sensors of the state of the art.

In addition, such a sensor is intended to be arranged on the periphery of the switching elements, such that its space requirement is lower.

According to other advantageous aspects of the invention, the method includes one or more of the following features, taken in isolation or in any technically possible combination:
- the production of the pads is a production by additive manufacturing;
- the production of the first segments is a production by additive manufacturing concomitant with the production of the pads;
- the method includes the arrangement of at least one electronic component between the first connection surface and a second connection surface of the second face, located opposite to the first connection surface, a first terminal of the electronic component being electrically connected to one of the first connection surface and the second connection surface, a second terminal of the electronic component being electrically connected to the other of the first connection surface and the second connection surface;
- the at least one electronic component is a semiconductor switching element;
- the switching element is a field effect transistor, the first terminal being a drain of the field effect transistor, the second terminal being a source of the field effect transistor, or a bipolar transistor, the first terminal being an emitter of the bipolar transistor, the second terminal being a collector of the bipolar transistor.

Furthermore, the invention relates to a short-circuit protection device, including:
- a first substrate comprising a first face carrying a plurality of first electrically conductive segments, each first segment being arranged on the periphery of a first connection surface of the first face, each first segment comprising a first end and an opposite second end, the first end being closer to the first connection surface than the second end, the first segments not being directly in electrical and mechanical contact with each other, each first segment being associated with a corresponding rank, the first segment associated with any given rank being arranged between the first segment of immediately lower rank and the first segment of immediately higher rank;
- a second substrate including a second face facing the first face of the first substrate, the second face carrying a plurality of second electrically conductive segments, each second segment being arranged on the periphery of a second connection surface of the second face located facing the first connection surface, the second segments not being directly in electrical and mechanical contact with each other, each second segment being associated with first two segments of successive ranks;
- a plurality of electrically conductive pads, distant from each other, each pad including a base and an opposite free end, each pad being in mechanical and electrical contact, by the base thereof, with a single corresponding first segment, the free end being at a distance from the first face and in mechanical and electrical contact with a single corresponding second segment, such that:
    - each first segment is in mechanical and electrical contact with two pads of the plurality of pads;
    - each second segment is in mechanical and electrical contact, on the one hand, with the pad which is in mechanical contact with the first segment of lower rank among the first two segments of successive ranks associated with the second segment, and which is closest to the first end of the first segment of lower rank, and, on the other hand, with the pad which is in mechanical contact with the first segment of higher rank among the first two segments of successive ranks associated with said second segment, and which is closest to the second end of the first segment of higher rank;
- the first segments, the second segments and the pads thus defining a coil forming a current sensor configured to deliver a signal representative of variations in electric current flowing between the first connection surface and the second connection surface.

According to an advantageous aspect of the invention, the short-circuit protection device further includes a control member connected to the output of the current sensor and configured to analyse the signal delivered by the current sensor.

The invention is also related to a power module comprising a short-circuit protection device as defined above, and at least one electronic component arranged between the first connection surface and the second connection surface of the second face, a first terminal of the electronic component being electrically connected to one of the first connection surface and the second connection surface, a second terminal of the electronic component being electrically connected to the other of the first connection surface and the second connection surface.

According to an advantageous aspect of the invention, the electronic component is a switching element, the control member being configured to put the electronic component in a blocked state in the case of detection, from the signal delivered by the current sensor, of an overcurrent.

BRIEF DESCRIPTION OF THE DRAWINGS

The invention will be better understood using the following description, given only by way of non-limiting example and made with reference to the appended drawings in which.

DETAILED DISCLOSURE OF PARTICULAR EMBODIMENTS

Figure 1:
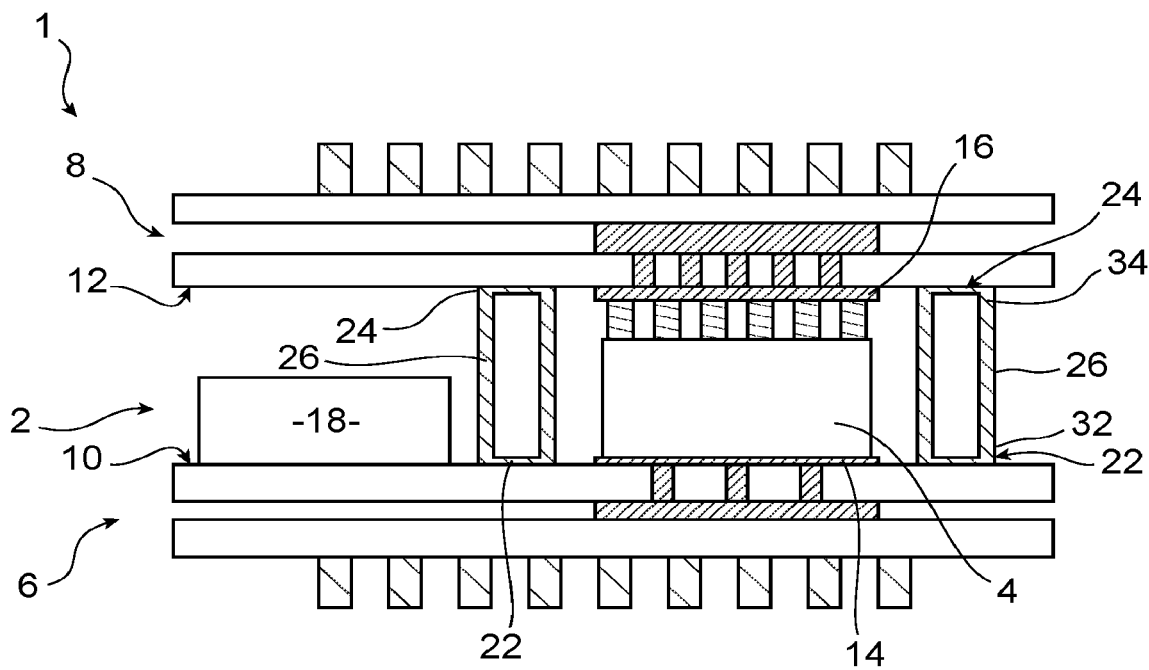
FIG. 1 is a schematic sectional representation of a power module incorporating a short-circuit protection device according to the invention, in a plane orthogonal to substrates of said power module.

A protection device 2 for the detection of a short-circuit, likely to affect at least one electronic component 4, is illustrated in FIG. 1.

The electronic component 4 is, in particular, a large gap semiconductor switching element, known to the person skilled in the art. For example, the electronic component 4 is a SiC MOSFET transistor (standing for "Silicon Carbide Metal Oxide Semiconductor Field Effect"). Alternatively, the electronic component 4 is a gallium nitride (GaN) switching element, or else a silicon switching element.

The protection device 2 is integrated in a power module 1.

The term, "power module", within the meaning of the present invention, means an electronic module having a cooling on two of the faces thereof, comprising a switching arm (including power transistors), a corresponding control member and a protection device.

The power module 1 includes a first substrate 6 and a second substrate 8 each extending in a plane orthogonal to the plane of FIG. 1. The first substrate 6 and the second substrate 8 respectively comprise a first face 10 and a second face 12, the first substrate 6 and the second substrate 8 being arranged such that the first face 10 and the second face 12 are facing each other and at a distance from each other.

The first substrate 6, respectively the second substrate 8 is, for example, a metallised ceramic substrate.

The first face 10 includes a first connection surface 14. Furthermore, the second face 12 includes a second connection surface 16. The first connection surface 14 and the second connection surface 16 are arranged facing each other.

Each of the first connection surface 14 and of the second connection surface 16 is electrically conductive, and is intended to be electrically connected to a respective terminal of at least one electronic component 4 housed between the first connection surface 14 and the second connection surface 16, as shown in FIG. 1.

For example, in the case where the electronic component 4 is a field effect transistor, the drain of the field effect transistor is electrically connected to one of the first connection surface 14 and the second connection surface 16, and the source of the field effect transistor is connected to the other of the first connection surface 14 and the second connection surface 16.

According to another example, in the case where the electronic component 4 is a bipolar transistor, the emitter of the bipolar transistor is electrically connected to one of the first connection surface 14 and the second connection surface 16, and the collector of the bipolar transistor is connected to the other among the first connection surface 14 and the second connection surface 16.

The protection device 2 includes a current sensor 20 and a control member 18 connected to the output of the current sensor 20.

The current sensor 20 is configured to deliver, at the two outputs 21 thereof, a signal representative of the variations in the electric current passing through the or each electronic component 4. More specifically, the coil forming the current sensor 20 is such that a variation in the current flowing between the first connection surface 14 and the second connection surface 16 causes, by induction, the appearance of a voltage between the two outputs 21, whose value is representative of the variations in the electric current passing through the or each electronic component 4 connected between the first connection surface 14 and the second connection surface 16.

The control member 18 is configured to analyse the signal delivered by the current sensor 20, and to detect the occurrence of an overcurrent affecting the or each electronic component 4 from such an analysis.

Furthermore, the control member 18 is configured to drive the electronic components 4 (including specific functions aimed at providing and controlling the charge and/or the discharge of the gate electrode of the electronic components 4 in order to allow their changes of state, such as passing from the open state to the closed state or from the closed state to the open state, as well as allow them to be maintained in an open or closed state), and to control their opening, that is to say their passage in a blocked state, in the case of detection of an overcurrent.

Figure 2:
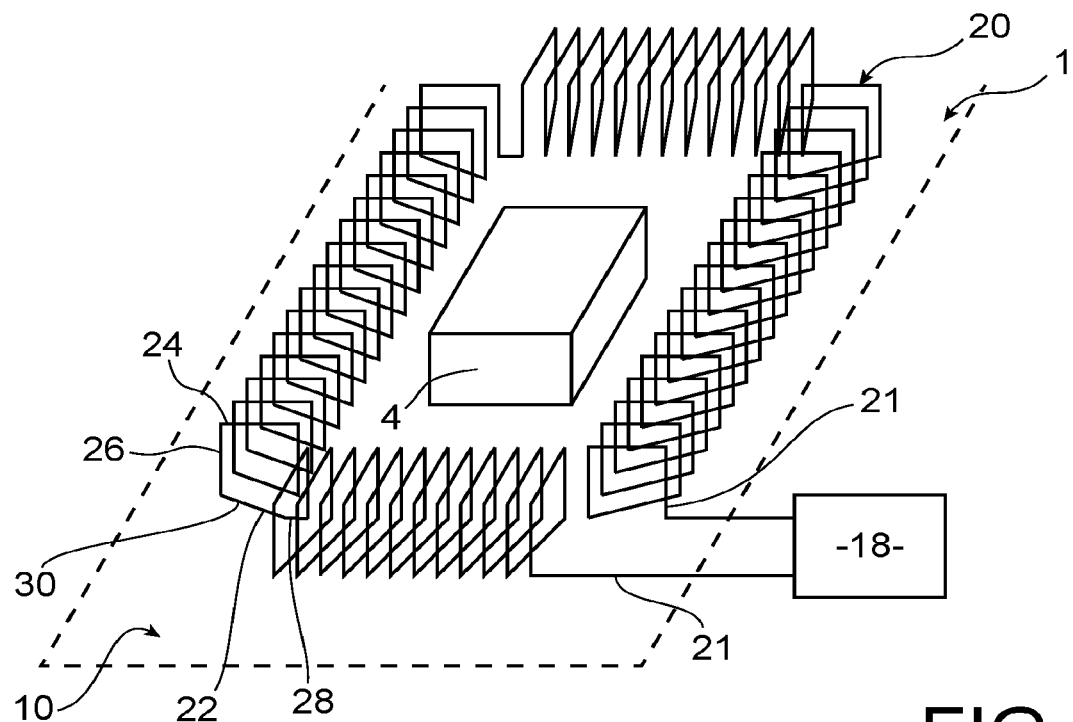
FIG. 2 is a schematic perspective representation of a coil of the protection device integrated into the power module of FIG. 1.

As emerges more clearly from FIG. 2, the current sensor 20 has the shape of a current coil, at least partially enclosing the volume located between the first connection surface 14 and the second connection surface 16. The current sensor 20 is also called "Rogowski winding".

With reference to FIG. 1, the current sensor 20 includes a plurality of first electrically conductive segments 22, a plurality of second electrically conductive segments 24 and a plurality of electrically conductive pads 26.

The first segments 22 and/or the second segments 24 and/or the pads 26 are, for example, made of aluminum, copper, or even an alloy comprising one or the other of these metals (for example an aluminium silicon magnesium AlSiMg alloy).

The first segments 22 take the form of electrically conductive tracks made on the first face 10 of the first substrate 6. Each first segment 22 comprises a first end 28 and an opposite second end 30.

More specifically, each first segment 22 is arranged on the periphery of the first connection surface 14 of the first face 10, the first end 28 thereof being closer to the first connection surface 14 than the second end 30 thereof.

Each first segment 22 is associated with a corresponding rank, the first segment 22 associated with any rank being arranged between the first segment 22 of immediately lower rank and the first segment 22 of immediately higher rank.

Within the meaning of the present invention, a first segment 22 is said to be "between two other first segments" when, in a polar coordinate system having as origin any point of the first connection surface 14 and as axes any two orthogonal axes of the first face 10 secant to said point of origin, the first end 28 of said first segment 22 has a polar coordinate (that is to say a polar angle, also called azimuth) comprised between the polar coordinate of the first end 28 of one among said two other first segments, and the polar coordinate of the first end 28 of the other among said two other first segments.

The second segments 24 take the form of electrically conductive tracks made on the second face 12 of the second substrate 8.

Each second segment 24 is associated with first two segments 22 of successive ranks.

Additional features of the second segments 24 will emerge from what follows.

The pads 26 are distant from each other. Each pad 26 extends along an axis orthogonal to the substrates 6, 8.

Each pad 26 includes a base 32 and an opposite free end 34.

Each pad 26 is in mechanical and electrical contact, through the base 32 thereof, with a single corresponding first segment 22, the free end 34 being at a distance from the first face 10. Preferably, each pad 26 is integral with the corresponding first segment 22.

Furthermore, each pad 26 is in mechanical and electrical contact, via the free end 34 thereof, with a single corresponding second segment 24. Preferably, the free end 34 of each pad 26 is brazed to the corresponding second segment 24.

The first segments 22, the second segments 24 and the pads 26 are arranged such that each first segment 22 is in mechanical and electrical contact with two pads 26, in particular exactly two pads 26.

More specifically, the first segments 22, the second segments 24 and the pads 26 are arranged such that each second segment 24 is in mechanical and electrical contact:
  with the pad 26 which is in mechanical contact with the first segment 22 of lower rank among the first two segments 22 of successive ranks associated with said second segment 24, and which is closest to the first end 28 of the first segment 22 of lower rank; and
  with the pad 26 which is in mechanical contact with the first segment 22 of higher rank among the first two segments 22 of successive ranks associated with said second segment 24, and which is closest to the second end 30 of the first segment 22 of higher rank.

It follows from the above that the first segments 22, the second segments 24 and the pads 26 are arranged so as to form the coil constituting the current sensor 20.

The manufacture of the protection device 2 according to the invention will now be described.

On the first face 10 of the first substrate 6, the first segments 22 are produced, for example by additive manufacturing.

As has been described previously, each first segment 22 is arranged on the periphery of the first connection surface 14 of the first face 10, the first end 28 thereof being closer to the first connection surface 14 than the second end 30 thereof.

The first segments 22 are electrically insulated from each other.

Furthermore, on the first face 10 of the first substrate 6, the pads 26 are produced by additive manufacturing. Preferably, the pads 26 and the first segments 22 are produced jointly by additive manufacturing. In this case, the pads 26 and the first segments 22 are made of the same material. Furthermore, in this case, each pad 26 and each corresponding first segment 22 are integral.

Furthermore, on the second face 12 of the second substrate 8, the second segments 24 are produced. The second segments 24 are electrically insulated from each other.

Then, the first face 10 of the first substrate 6 and the second face 12 of the second substrate 8 are placed opposite to each other, to bring the free end 34 of each pad 26 into mechanical and electrical contact with the corresponding second segment 24.

A brazing operation is then carried out to secure the free end 34 of each pad 26 to the corresponding second segment 24.

Due to the previously described geometric features of the first segments 22, of the second segments 24 and of the pads 26, such a manufacturing method leads to the production of the current sensor 20 in the form of an electrically conductive coil.

The terminals 21 of the current sensor 20 are also connected to the input of the control unit 18.

The used additive manufacturing method is, for example, the method called SLM ("Selective Laser Melting") method.

Such a manufacturing method is advantageous. Indeed, the implementation of the additive manufacturing for the production of the pads 26 enables an accurate positioning of said pads, such that the response of the current sensor 20 conforms to the expected response. Furthermore, thanks to such a method, the pads 26 have a satisfactory resistance to the shear forces, in particular a good adhesion of the pads 26 to the first segments 22, which gives good robustness to the current sensor 20.

Furthermore, such a method makes it unnecessary to add discrete components, likely to disrupt the operation of the electronic components 4, to carry out the current measurement.

Furthermore, such a method enables a simple dimensioning of the current sensor 20, so that the latter can operate, with a reduced risk of damage, in a high temperature environment.

Furthermore, such a method enables producing simply, and in a single operation, a current sensor 20 around each electronic component 4. This enables, for example, a measurement of the imbalance between the electronic components 4 of a given power module (for example, transistors in parallel of a power module), with the aim of controlling said components to reduce such an imbalance and prolong the service life of the power module.

Furthermore, the joint production of the first segments 22 and the pads 26 simplifies said production and gives it a greater repeatability.

Alternatively, the manufacturing method also includes the production of pads 26 on the second segments 24. What has been previously described, in particular as regards the placing of the substrates 6, 8 opposite to each other also applies, the second segments 24 carrying a pad 26 acting as the previously described first segments 22, and the first segments 22 intended to receive the free end of said pads 26 acting, in this case, as the previously described second segments 24.

The invention claimed is:

1. A method for manufacturing a short-circuit protection device for electronic component, comprising:

producing, on a first face of a first substrate, a plurality of first electrically conductive segments, each first segment being arranged on a periphery of a first connection surface of the first face, each first segment comprising a first end and an opposite second end, the first end being closer to the first connection surface than the second end, the first segments being electrically insulated from each other, each first segment being associated with a corresponding rank, the first segment associated with any given rank being arranged between the first segment of immediately lower rank and the first segment of immediately higher rank;

producing, on the first face of a first substrate, a plurality of electrically conductive pads, which are distant from each other, each pad comprising a base and an opposite free end, each pad being in mechanical and electrical contact, through the base thereof, with a single corresponding first segment, the free end being at a distance from the first face;

producing, on a second face of a second substrate, a plurality of second electrically conductive segments, which are electrically insulated from each other, each second segment being associated with first two segments of successive ranks;

placing the first face of the first substrate and the second face of the second substrate opposite to each other, to bring the free end of each pad into mechanical and electrical contact with a single corresponding second segment, such that:

each first segment is in mechanical and electrical contact with two pads of the plurality of pads; and each second segment is in mechanical and electrical contact with the pad which is in mechanical contact with the first segment of lower rank among the first two segments of successive ranks associated with the second segment, and which is closest to the first end of the first segment of lower rank, and wherein each second segment is in mechanical and electrical contact with the pad which is in mechanical contact with the first segment of higher rank among the first two segments of successive ranks associated with the second segment, and which is closest to the second end of the first segment of higher rank;

the first segments, the second segments and the pads thus forming a coil, the method further comprising the arrangement of at least one electronic component between the first connection surface of the first face and a second connection surface of the second face, the second connection surface being located facing the first connection surface, a first terminal of the electronic component being electrically and mechanically connected to one of the first connection surface and the second connection surface, a second terminal of the electronic component being electrically and mechanically connected to the other of the first connection surface and the second connection surface, and the coil enclosing a volume around the electronic component and located between the first connection surface and the second connection surface.

2. The manufacturing method according to claim 1, wherein the production of the pads is a production by additive manufacturing.

3. The manufacturing method according to claim 2, wherein the production of the first segments is a production by additive manufacturing concomitant with the production of the pads.

4. The manufacturing method according to claim 3, wherein the at least one electronic component is a large gap semiconductor switching element.

5. The manufacturing method according to claim 4, wherein the switching element is a field effect transistor, the first terminal being a drain of the field effect transistor, the second terminal being a source of the field effect transistor, or a bipolar transistor, the first terminal being an emitter of the bipolar transistor, the second terminal being a collector of the bipolar transistor.

6. A short-circuit protection device for electronic component, comprising:
a first substrate comprising a first face carrying a plurality of first electrically conductive segments, each first segment being arranged on a periphery of a first connection surface of the first face, each first segment comprising a first end and an opposite second end, the first end being closer to the first connection surface than the second end, the first segments not being directly in electrical and mechanical contact with each other, each first segment being associated with a corresponding rank, the first segment associated with any given rank being arranged between the first segment of immediately lower rank and the first segment of immediately higher rank;
a second substrate comprising a second face facing the first face of the first substrate, the second face carrying a plurality of second electrically conductive segments, each second segment being arranged on a periphery of a second connection surface of the second face, the second connection surface being located facing the first connection surface, the second segments not being directly in electrical and mechanical contact with each other, each second segment being associated with first two segments of successive ranks;
the electronic component arranged between the first face of the first substrate and the second face of the second substrate, the electronic component being provided with a terminal mechanically connected to the first connection surface and another terminal mechanically connected to the second connection surface,
a plurality of electrically conductive pads, distant from each other, each pad comprising a base and an opposite free end, each pad being in mechanical and electrical contact, by the base thereof, with a single corresponding first segment, the free end being at a distance from the first face and in mechanical and electrical contact with a single corresponding second segment, such that:
each first segment is in mechanical and electrical contact with two pads of the plurality of pads;
each second segment is in mechanical and electrical contact with the pad which is in mechanical contact with the first segment of lower rank among the first two segments of successive ranks associated with the second segment, and which is closest to the first end of the first segment of lower rank, and,
each second segment is in mechanical and electrical contact with the pad which is in mechanical contact with the first segment of higher rank among the first two segments of successive ranks associated with said second segment, and which is closest to the second end of the first segment of higher rank;
the first segments, the second segments and the pads thus defining a coil forming a current sensor configured to deliver a signal representative of variations in electric current flowing between the first connection surface and the second connection surface, said coil enclosing a volume located between the first connection surface and the second connection surface.

7. The short-circuit protection device according to claim 6, further comprising a control member connected to an output of the current sensor and configured to analyze the signal delivered by the current sensor.

8. The short-circuit protection device according to claim 6, wherein the electronic component is a semiconductor switching element.

9. A power module according to claim 7, wherein the electronic component is a switching element, the control member being configured to put the electronic component in a blocked state in a case of detection, from the signal delivered by the current sensor, of an overcurrent.

10. The short-circuit protection device according to claim 6, wherein the electronic component is a large gap semiconductor switching element.

11. The manufacturing method according to claim 1, wherein the volume is around the electronic component and extends from the first connection surface to the second connection surface.

* * * * *